United States Patent [19]
Armstrong et al.

[11] Patent Number: 5,959,247
[45] Date of Patent: Sep. 28, 1999

[54] LOW COST PROTECTIVE COATING AND METHOD FOR A DIE-ON-BOARD ELECTRONIC ASSEMBLY

[76] Inventors: Joseph H. Armstrong, 8720 S. Ammons St., Littleton, Colo. 80128; Mohan S. Misra, 14515 W. Byers Pl., Golden, Colo. 80401; Anil K. Kapuria, 21427 Continental Cir., Saratoga, Calif. 95070

[21] Appl. No.: 08/898,565

[22] Filed: Jul. 22, 1997

[51] Int. Cl.⁶ .................................................. H01L 23/28
[52] U.S. Cl. .......................... 174/52.2; 257/788; 257/790
[58] Field of Search .................................. 174/52.2, 255, 174/260; 257/672, 688, 692, 788, 790, 682, 687; 438/127; 29/841, 855

[56] References Cited

U.S. PATENT DOCUMENTS

| | | | |
|---|---|---|---|
| 4,323,405 | 4/1982 | Uno et al. | 156/64 |
| 4,677,528 | 6/1987 | Miniet | 361/751 |
| 4,737,379 | 4/1988 | Hudgens et al. | 427/39 |
| 4,794,018 | 12/1988 | Scheetz | 427/96 |
| 4,814,943 | 3/1989 | Okuaki | 361/400 |
| 5,033,253 | 7/1991 | Havens et al. | 53/427 |
| 5,302,553 | 4/1994 | Abbott et al. | 438/127 |
| 5,313,365 | 5/1994 | Pennisi et al. | 361/760 |
| 5,354,577 | 10/1994 | Klingel | 427/96 |
| 5,399,903 | 3/1995 | Rostoker et al. | 257/666 |
| 5,510,138 | 4/1996 | Sanftleben et al. | 427/96 |
| 5,536,906 | 7/1996 | Haas, Jr. et al. | 174/52.4 |
| 5,601,905 | 2/1997 | Watanabe et al. | 428/215 |

*Primary Examiner*—Kristine Kincaid
*Assistant Examiner*—Hung V Ngo
*Attorney, Agent, or Firm*—Snell & Wilmer L.L.P.

[57] ABSTRACT

An electronic circuit assembly includes a printed circuit board having a plurality of conductors formed thereon. An integrated circuit die is mounted directly on and bonded to the circuit board. A plurality of microleads extend between the integrated circuit die and conductors and are ultrasonically bonded to the die and conductors. A protective coating deposited on the circuit board encapsulates the circuit die and microleads. Methods for depositing the coating include flow and cure, immersion and plasma spray techniques.

10 Claims, 2 Drawing Sheets

LOW COST PROTECTIVE COATING AND METHOD FOR A DIE-ON-BOARD ELECTRONIC ASSEMBLY

TECHNICAL FIELD OF THE INVENTION

The present invention relates generally to an electronic assembly including an integrated circuit die directly mounted on and bonded to a printed circuit board and, more particularly, relates to a low cost protective coating for such an assembly.

BACKGROUND OF THE INVENTION

Integrated circuits are widely utilized in electronic equipment and components. Typically, a "device package" assembly (such as, for example, dual in-line for thru-hole mount package assemblies and many surface package assemblies) is utilized to protect the integrated circuit die and associated conductive leads ultrasonically bonded thereto from shock, moisture, light and other environmental factors. In a conventional device package assembly, an integrated circuit die constructed on a semiconductor wafer is encapsulated within and bonded to a protective housing. Conductive microleads are ultrasonically bonded between the die and conductive contacts formed in the device package housing. The device package is sealed to protect the die and leads, and is sold as a stand-alone component in this fashion. In a separate and later manufacturing step, the device package is appropriately mounted on a printed circuit board, and solder joints are formed between the device package conductive contacts and the patterned conductors on the circuit board.

Device packages, while promoting flexibility and convenience for hobbyists and other low volume manufacturing applications, lead to significantly increased assembly costs in high volume manufacturing applications. In high volume applications, it is often the case that identical device packages are repetitively bonded to identical printed circuit boards. Single inline memory modules (SIMMs) and dual inline memory modules (DIMMs), which are incorporated into computer memory components, are examples of such high volume applications. In such repetitive applications, significant time and cost savings could be attained if one were able to eliminate the separate packaging for the integrated circuit die and simply mount the die directly to the printed circuit board. In this manner, unnecessary packaging would be eliminated and assembly could be automated.

Device packages have become standard out of the necessity to protect the sensitive ultrasonically-bonded leads and associated circuitry from a host of damaging environmental factors. In order to mount integrated circuit dies directly to printed circuit boards and remove the necessity for device packages, therefore, an alternative means for protecting the ultrasonically bonded leads from environmental factors is necessary.

SUMMARY OF THE INVENTION

One object of the present invention is to remove the necessity for device packaging by providing an assembly and method in which an integrated circuit die is directly mounted on a printed circuit board and a protective coating is deposited thereover.

Another object of the present invention is to provide a low cost assembly and method which is adaptable to large volume manufacturing techniques and is easily integrated into an automated assembly process.

A further object of the present invention is to provide a protective coating for a circuit die mounted directly on a printed circuit board that is highly adherent to the circuitry and associated leads, that is protective against moisture, dirt, static electricity and other environmental factors, that is compatible with existing assembly techniques, that is non-destructive to sensitive integrated circuit dies, microleads and ultrasonic bonds, and that is capable of withstanding operating temperatures of electronic circuits.

In accordance with these and other objects of the present invention, a method and assembly is provided in which an integrated circuit die is directly mounted on a printed circuit board having a plurality of conductors formed thereon. A plurality of microleads are extended between the integrated circuit die and the conductors and are ultrasonically bonded to the integrated circuit die and to the conductors. A protective coating is then deposited on the circuit board to encapsulate the integrated circuit die and the microleads.

These and other aspects of the present invention are described in more detail in the following description, attached drawing figures, and claims.

BRIEF DESCRIPTION OF THE DRAWING FIGURES

DETAILED DESCRIPTION OF PREFERRED EMBODIMENTS OF THE INVENTION

Figure 1:
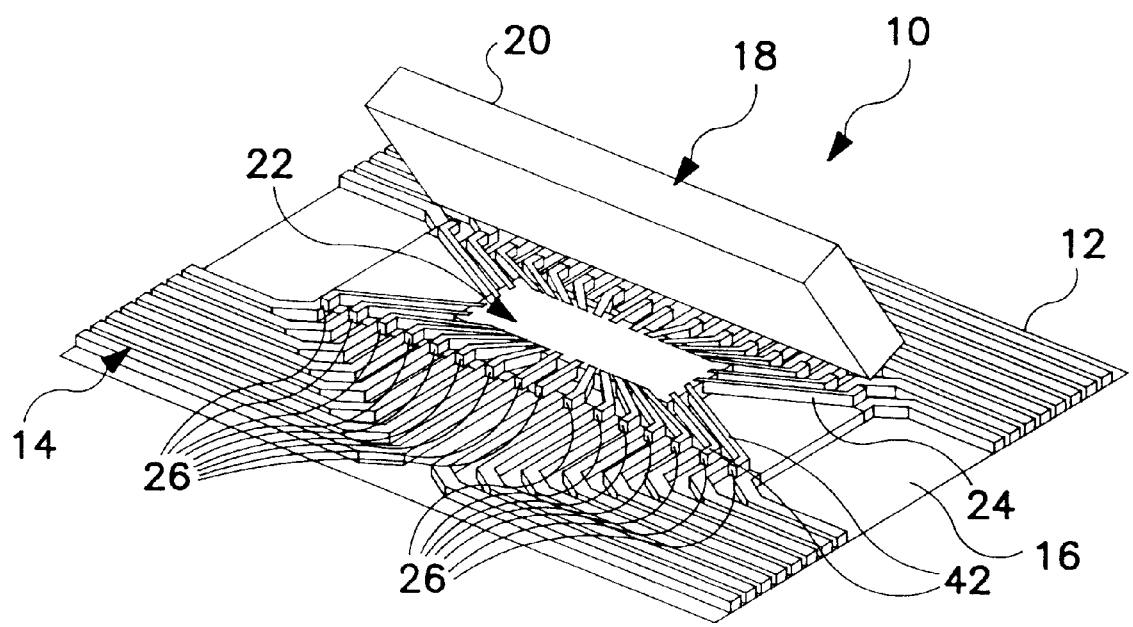
FIG. 1 is a perspective view of a prior art device package assembly.

A prior art device package assembly is illustrated in FIG. 1. Device package assembly 10 includes a printed circuit board 12 formed with a plurality of conductors 14 arranged in an appropriate pattern. A central portion 16 of board 12 is free of conductor patterns and is situated for receipt of device package 18.

Device package 18 includes a protective housing 20 in which is disposed integrated circuit die 22. Integrated circuit die 22 is bonded to device package 18 and thereby fixed for relative movement. Conductive microleads 24 are ultrasonically bonded to circuit die 22 and extend from die 22 to conductive contacts 26 formed at the peripheral edges of housing 20. Microleads 24, which are typically formed from gold or aluminum, are also ultrasonically bonded to contacts 26. Once die 22 has been fixed within device package 18 and microleads 24 have been ultrasonically bonded to appropriate contacts 26, device package 18 is sealed to protect the internal circuitry.

Device package 18 (constructed and sealed as described above) and printed circuit board 12 are conventionally sold as separate components. A manufacturer buys the components separately and solders device package 18 onto board 12 when ready for use or installation. The underside of device package 18 may be bonded to central portion 16 of board 12, and solder joints are formed between conductors 14 and conductive contacts 26 of device package 18. Alternatively, appropriately formed contacts on device package 18 may be inserted into conductive sockets formed in circuit board 12.

This prior art approach is advantageous in that it provides significant flexibility in assembly. A single device package can be matched with a plurality of circuit board configurations. This flexibility is quite important to hobbyists and other low volume manufacturers. Where flexibility is not necessary, however, this approach leads to unnecessary costs. In certain high volume applications, such as the assembly of computer memory components, for example, particular device packages are always matched with, and assembled onto, the same printed circuit boards. In such applications, the added costs associated with the device package protective housing and the extra manufacturing step of affixing the device package to the circuit board are a drawback.

Figure 2:
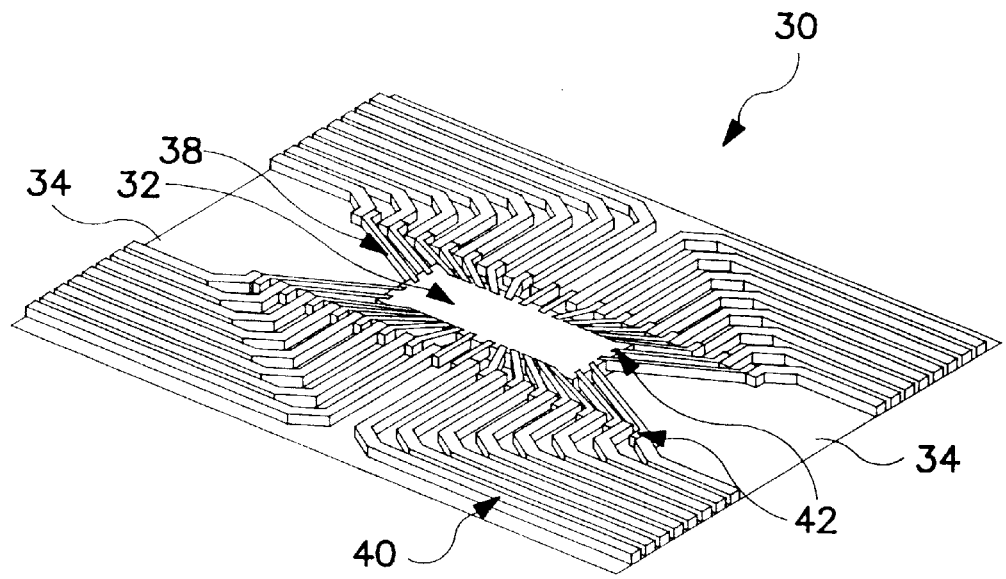
FIG. 2 is a perspective view of an assembly according to the present invention in which an integrated circuit die is directly mounted and bonded to a printed circuit board.

In repetitive high volume applications it would be advantageous to eliminate the device package assembly and to market the integrated circuit die and printed circuit board as a single, preassembled component. This is the object of the present invention. FIG. 2 illustrates a simpler circuit assembly 30 according to the present invention in which integrated circuit die 32 is mounted directly onto printed circuit board 34. A suitable adhesive may be utilized to bond the underside of die 32 to central portion 36 of board 34. Conductive microleads 38 extend between die 32 and conductors 40, and ultrasonic bonds are formed at locations 42 between, respectively, leads 38 and die 32, and leads 38 and conductors 40.

Figure 3:
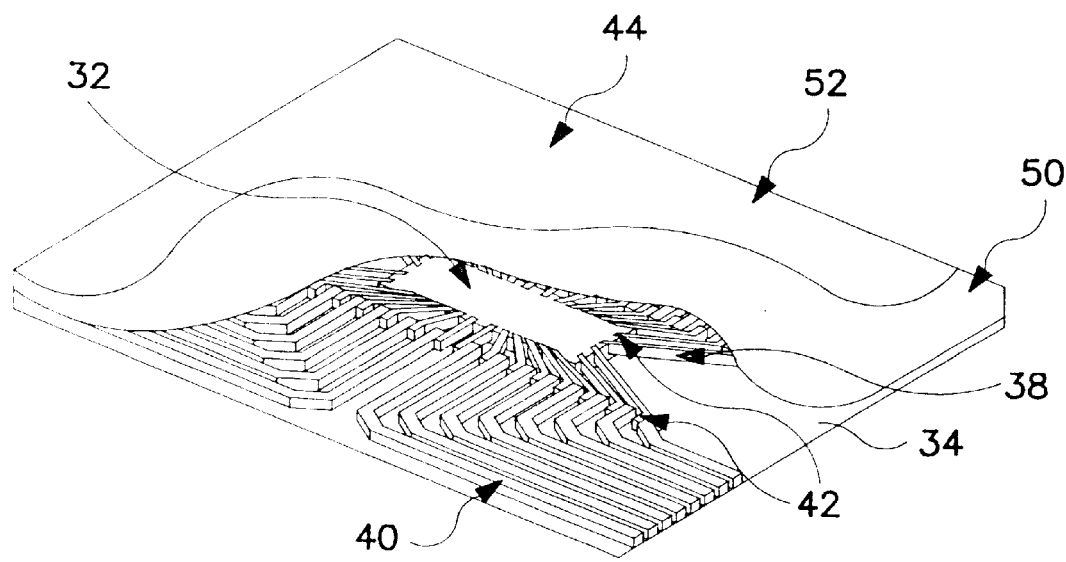
FIG. 3 is a perspective, partially cut-away view showing deposition of a protective coating over the assembly of FIG. 2 in accordance with the present invention.

Assembly 30 of FIG. 2 provides significantly reduced complexity and reduced manufacture and assembly costs relative to prior art device package assembly 10 of FIG. 1. However, as the necessity for protecting the sensitive ultrasonically-bonded leads gave rise to the device package configuration of FIG. 1, a means for protecting the assembly of FIG. 2 is also necessary. The present invention, as depicted in FIG. 3, provides a low cost protective coating 44 for circuit assembly 30 that is easily adaptable to large volume manufacturing techniques.

Conformal coating 44 is deposited over assembly 30 at the end of the manufacturing process after die 32 has been bonded and interconnected to circuit board 34. Coating 44 must meet a number of criteria. It must be highly adherent to both the electronic circuitry and to the printed circuit board and must be protective against moisture, dirt and static electricity. Additionally, the coating must be applied through use of low cost deposition techniques that are compatible with existing assembly techniques. Finally, the coating must be nondestructive to sensitive integrated circuits, microleads and ultrasonic bonds and be capable of withstanding the standard range of operating temperatures of electronic circuitry. Applicants have developed several coating deposition methods and have identified several coating materials which meet each of these criteria.

One deposition method according to the present invention utilizes ether-vinyl-acetate (EVA) 50 in sheet form as a protective coating. A section of an EVA 50 sheet larger than the area to be coated is cut and manually laid on top of the portion of the circuit assembly to be coated. The circuit assembly and appropriately-positioned EVA 50 sheet are then heated in an infrared inline oven such that the EVA 50 flows over and coats the circuit assembly (or portion thereof). Upon removal of the heat source, the EVA 50 solidifies into a protective coating without destruction of the circuit die, microleads or ultrasonic bonds. This deposition method is advantageous in that infrared inline ovens are already in use in the industry. Moreover, specific parts of the circuit assembly could be coated with EVA 50 without coating the entire assembly. This option is particularly suited to circuit assemblies wherein multiple circuit dies are mounted on one circuit board.

In another deposition method according to the present invention the circuit assembly is immersed in a liquid bath of polymer or other encapsulant material. After withdrawal from the bath, the coated assembly is cured in the ambient atmosphere or in a furnace. This method is advantageous in that the coating thoroughly surrounds and encapsulates all leads to provide a high level of protection without noticeable stress to the microleads or ultrasonic bonds.

A third deposition method according to the present invention utilizes plasma spray. In plasma spray deposition, an electrically-generated plasma heats particular powders to their melting point, and the melted powders are then propelled towards the assembly to be coated. As the individually melted particles are small in size, little heat is transferred to the assembly being coated. This coating method is advantageous in that it permits deposition of large volumes of materials over large areas through use of an automated process, and requires no post-cure processing.

Ceramic or polymer powders 52 are suitable source materials for the plasma spray. In order to protect sensitive microleads, an initial coating is applied over the area to be coated. Such a coating may be applied, for example, through use of a manually laid and heated EVA 50 sheet as described above. After the initial coating is applied, a ceramic or polymer plasma spray provides an inert, impact-resistant and electrically insulative outer coating 52. The surface of this outer coating can be tailored to expedite heat transfer to the environment and thereby facilitate efficient cooling of the operating electronic circuitry.

The present invention has been described with reference to several particular embodiments and drawing figures. It should be realized, however, that the scope of the invention is not limited to these specific embodiments. Modification may be made to the selection, design and arrangement of the component parts of the embodiments described herein without departing from the scope of the invention as represented in the following claims.

We claim:

1. An electronic circuit assembly comprising:

a printed circuit board having a plurality of conductors formed thereon;

an integrated circuit die mounted on said circuit board;

a plurality of microleads extending between said integrated circuit die and said plurality of conductors, said microleads ultrasonically bonded to said integrated circuit die and to said plurality of conductors; and a protective coating deposited on said circuit board and encapsulating said integrated circuit die and said plurality of microleads, wherein said protective coating comprises an ether-vinyl-acetate sheet.

2. An electronic circuit assembly as claimed in claim 1, wherein an adhesive is disposed between an underside of said integrated circuit die and said printed circuit board.

3. An electronic circuit assembly as claimed in claim 1, wherein said protective coating is melted and solidified over said integrated circuit die and said microleads.

4. An electronic circuit assembly as claimed in claim 1, wherein said protective coating further comprises at least one of a cured polymer, plasma sprayed ceramic and plasma sprayed polymer over said ether-vinyl-acetate sheet.

5. A method of assembling an electronic circuit assembly comprising:

providing a printed circuit board having a plurality of conductors formed thereon;

mounting an integrated circuit die on said circuit board;

extending a plurality of microleads between said integrated circuit die and said plurality of conductors;

ultrasonically bonding said microleads to said integrated circuit die and to said plurality of conductors; and depositing a protective coating on said circuit board to encapsulate said integrated circuit die and said plurality of microleads, wherein said protective coating comprises an ether-vinyl-acetate sheet.

6. A method as claimed in claim 5, wherein said deposition step further comprises immersing said assembly into a liquid bath of protective material, withdrawing said assembly from said bath, and allowing said protective material to cure over said ether-vinyl-acetate sheet.

7. A method as claimed in claim 6, wherein said protective material is a polymer.

8. A method as claimed in claim 5, wherein said deposition step comprises cutting a section of a sheet of protective material larger than an area to be coated, manually laying said sheet over said area to be coated, applying a heat source to said sheet such that it flows over said area to be coated, and removing said heat source from said sheet such that it solidifies into said protective coating.

9. A method as claimed in claim 5, wherein said deposition step further comprises plasma spray deposition of a protective material over said ether-vinyl-acetate sheet.

10. A method as claimed in claim 9, wherein said protective material is at least one of ceramic and polymer.

* * * * *